United States Patent
Rinaldi et al.

(10) Patent No.: US 6,295,190 B1
(45) Date of Patent: Sep. 25, 2001

(54) CIRCUIT BREAKER ARRANGEMENT WITH INTEGRATED PROTECTION, CONTROL AND MONITORING

(75) Inventors: Peter Rinaldi, Mystic; Matthew L. Kasson, Voluntown, both of CT (US)

(73) Assignee: Electric Boat Corporation, Groton, CT (US)

( * ) Notice: Subject to any disclaimer, the term of this patent is extended or adjusted under 35 U.S.C. 154(b) by 0 days.

(21) Appl. No.: 09/427,420

(22) Filed: Oct. 26, 1999

(51) Int. Cl.[7] .................................................. H01H 73/00
(52) U.S. Cl. ............................ 361/115; 361/93.1; 361/96
(58) Field of Search ............................... 361/117, 93.1, 361/96, 115

(56) References Cited

U.S. PATENT DOCUMENTS

| | | | |
|---|---|---|---|
| 4,237,520 | 12/1980 | Oishi et al. | 361/335 |
| 4,456,865 | * 6/1984 | Robertson, Jr. et al. | 318/599 |
| 4,644,438 | 2/1987 | Puccinelli | 361/75 |
| 4,689,752 | 8/1987 | Fernandes | 364/492 |
| 4,742,197 | 5/1988 | Mauthe | 200/148 B |
| 4,796,027 | 1/1989 | Smith-Vaniz | 340/870.03 |
| 4,799,005 | 1/1989 | Fernandes | 324/127 |
| 5,272,460 | 12/1993 | Baumgartner et al. | 336/96 |
| 5,552,978 | 9/1996 | Moncorge | 363/89 |
| 5,652,507 | 7/1997 | Blakely | 324/127 |
| 5,877,691 | * 3/1999 | Suptitz et al. | 361/93.1 |

* cited by examiner

Primary Examiner—Stephen W. Jackson
(74) Attorney, Agent, or Firm—Baker Botts L.L.P.

(57) ABSTRACT

A PCM module arrangement includes a three phase circuit breaker and PCM electronics unit. Each phase of the circuit breaker has a Rogowski coil at the line side and load side contacts in a vacuum bottle and another zero sequence current sensor encloses the load side conductors of the circuit breaker to provide a zero sequence current signal. A PCM electronics unit is provided with phase current measurement signals from the Rogowski coils. The PCM electronics unit provides a direct interface for various signals including a signal from a supervisory control and data acquisition system. The PCM electronics unit, combined with the multiple interface connections, permits a set of highly integrated PCM functions to be carried out, enabling the PCM module to selectively respond to both phase and sensitive ground faults when applied to various types of equipment and apparatus in generation and distribution systems which are characterized by distributed architectures and high resistance system grounding with a minimal number of sensors and logic devices. The PCM module also accommodates a wide range of electrical system voltage and frequencies.

7 Claims, 3 Drawing Sheets

CIRCUIT BREAKER ARRANGEMENT WITH INTEGRATED PROTECTION, CONTROL AND MONITORING

BACKGROUND OF INVENTION

This invention relates to circuit breaker arrangements which provide electrical protection, control and monitoring functions for medium voltage electrical power generation and delivery systems. In particular, this invention relates to circuit breaker arrangements that integrate and enhance the protection, control and monitoring functions required for electrical power generation and delivery systems.

Various prior art protection, control and monitoring disclosures describe concepts for achieving more enhanced and/or integrated protection, control and monitoring (PCM) for power delivery systems.

For example, the Mauthe U.S. Pat. No. 4,742,197 discloses a high voltage gas-insulated circuit interrupter which utilizes Rogowski coils to measure current at both ends of the interrupter. That patent describes a high voltage switch to which current measuring heads can be fitted by a simple arrangement in an easily accessible manner outside the region of the interrupter chamber. A Rogowski coil may be used in the measuring head and such measuring heads may be applied to high voltage circuit breakers and other switchgear.

The Baumgartner et al. U.S. Pat. No. 5,272,460 discloses a current and voltage transformer for a metal-encapsulated, gas-insulated high voltage switching installation having small dimensions capable of incorporation without problems at any point in the installation. A Rogowski coil is used for current measurement.

The Oishi et al. U.S. Pat. No. 4,237,520 discloses a gas-insulated switchgear arrangement which enables reduction of floor space for mounting and which is easy to install, maintain and inspect.

The Puccinelli et al. U.S. Pat. No. 4,644,438 discloses a current-limiting circuit breaker having a selective solid state trip unit providing circuit breaker contact separation by electro-dynamic repulsion toward the open position to effect current limiting when fault current exceeds a predetermined threshold. Rogowski coils may be used for fault current detection.

The Fernandez U.S. Pat. No. 4,799,005 discloses an electrical power line parameter measurement arrangement including compact, line-mounted modules. Current sensing provided by Rogowski coils is used for control and monitoring as well as in protection arrangements including bus and transformer differential. Relay systems actuated by the sensors operate circuit breakers to provide fault protection.

The Moncorge U.S. Pat. No. 5,552,978 discloses an arrangement for supplying a voltage to an electronic circuit, in particular an electronic circuit associated with a current sensor disposed on a high tension electrical line, to derive power from the current that passes through the high tension line. The power supply uses a torus provided with a magnetic core and a secondary winding to extract power from the line. A Rogowski coil is used to measure the line current.

The Blakely U.S. Pat. No. 5,652,507 discloses an arrangement and a method for measuring an AC current which saturates the core of a current transformer.

None of the prior art provides an arrangement for integrating protection, control and monitoring functions directly into a medium voltage circuit breaker design

SUMMARY OF THE INVENTION

Accordingly, it is an object of the present invention to provide a PCM module arrangement which includes a medium voltage circuit breaker with integrated protection, control and monitoring (PCM) components, such as a PCM electronics unit, sensors and multiple interface connections, which overcomes disadvantages of the prior art.

Another object of the invention is to provide a PCM module arrangement which integrates protection, control, and monitoring features of the arrangement into a standard configurable PCM electronics unit, integrates current sensing devices into the PCM module's circuit breaker and provides a direct interface at the PCM module's electronics unit to input multiple sensed parameters.

A further object of the invention is to provide a PCM module arrangement which selectively locates a phase fault or a sensitive ground fault on electrical generation and distribution systems, characterized by embodying distributed architectures, i.e., looped interconnections or zonal interconnections with multiple switchboards connected in series with multiple tie cables, interconnection of switchboards or generators connected to different switchboards, and having a high impedance system ground.

An additional object of the invention is to provide a PCM module which includes optimized sensors as part of the PCM module to assure a maximum degree of sensitivity for the detection of phase currents and zero sequence currents.

These and other objects of the invention are attained by providing a PCM module arrangement which includes a medium voltage circuit breaker arrangement having Rogowski coil current sensors at both the line side and the load side in each phase of the circuit breaker, along with a zero sequence current sensor enclosing all of the circuit breaker load lines for sensing ground current, and a PCM electronics unit including multiple-interface connections.

With this arrangement, various configurations of PCM functions can be provided by the PCM module so that a single PCM module design can be applied to various types of equipment and apparatus, such as generators, transformers, bus ties, motors and switchboard-bus protection, to provide the different PCM functions normally required for each type of equipment without the need for multiple discrete PCM logic devices and associated sensors.

An arrangement of this type provides an increased sensitivity, i.e., ability to obtain lower minimum pickup settings by using the Rogowski coil phase current sensors and the zero sequence current sensor.

In a particular embodiment of the invention, a PCM module includes an integrated combination of a medium voltage circuit breaker capable of operation over a wide range of voltages and frequencies with integrated line and load phase current sensing, a load side zero sequence current sensing signal interface, line and load side voltage sensing signal interfaces, a supervisory control and data acquisition interface, an interface for remote end differential current signals and an integrated, multifunction, configurable PCM electronics unit. The integrated multifunction PCM electronics unit, in conjunction with the electronic interfaces, provides multiple protection, control and monitoring functions that are configurable to achieve the functions required for specific applications. The PCM module provides a circuit breaker and PCM electronics unit that is configurable to provide either dedicated generator protection, control and monitoring, dedicated bus tic protection, control and monitoring, dedicated transformer protection, control and monitoring, or dedicated motor protection, control and monitoring, and the PCM modules are capable of joint configuration to provide bus protection.

Preferably, all the logic required to accomplish these functions is integrated into the PCM electronics unit of the PCM module and the PCM electronics unit operates in conjunction with the supervisory control and data acquisition system to coordinate PCM functions with the overall electric plant.

This allows PCM functions to be optimized for the type of equipment to be protected, i.e., generators, transformers, bus ties, feeders, motors, and switchboards or buses. It also allows selectively locating both phase faults and sensitive ground faults on distribution systems requiring distributed architectures, flexible operation and restricted design ground fault currents. Thus, the invention provides a PCM module arrangement that, together with a supervisory control and data acquisition system interface, is highly integrated and configurable so that it can satisfy all the normal protection, control and monitoring requirements that are different for each specific application of the circuit breaker. Each application is dependent on the various types of equipment normally encountered in a medium voltage generation and distribution system. All of the control and monitoring features, i.e., synchronizing features, power flow monitoring features and open/close features, are provided by the PCM module and operate in conjunction with the supervisory control and data acquisition system.

The invention also provides a PCM module design that is flexible with respect to electrical system characteristics such that it may be installed for a wide range of system voltages (5–15 KV) and frequencies (50–400 Hz) and can provide all the necessary functions required for any system grounding arrangement, i.e., high resistance, high resistance hybrid, medium, low and effective ground resistance. The PCM module design is also flexible with respect to the location of the system ground, i.e., at the generator neutral or at a switchboard derived through a transformer.

In addition, the invention provides an arrangement in which the PCM electronics unit of the PCM module provides for an interface with the PCM electronics units of other PCM modules to provide phase and sensitive ground differential and/or directional comparison bus protection for a switchboard or bus to which a PCM module is connected. In addition to this cooperative bus protection, each PCM module may be configured to protect its individual circuit using differential and/or directional methods. In this arrangement, the bus protection and individual circuit protection are integrated into the PCM electronics unit of the PCM module, thereby minimizing the number of current sensors and logic devices and maximizing the number of protective functions.

BRIEF DESCRIPTION OF THE DRAWINGS

Further objects and advantages of the invention will be apparent from a reading of the following description in conjunction with the accompanying drawings in which.

DESCRIPTION OF THE PREFERRED EMBODIMENT

Figure 1:
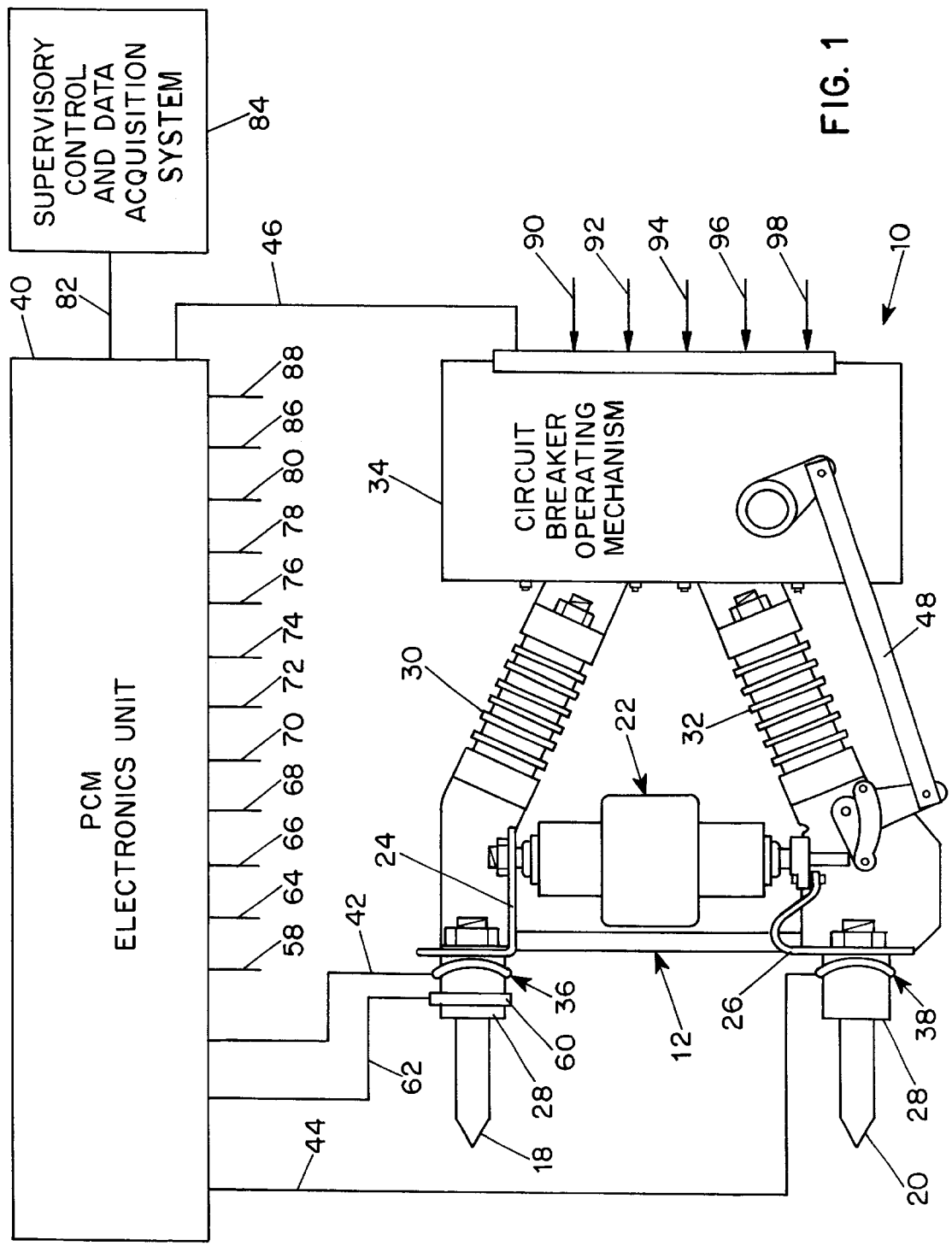
FIG. 1 is a side view illustrating a representative embodiment of a PCM module including a vacuum circuit breaker with integral PCM electronics unit, current sensors and associated external electronic interface signals.
Figure 2:
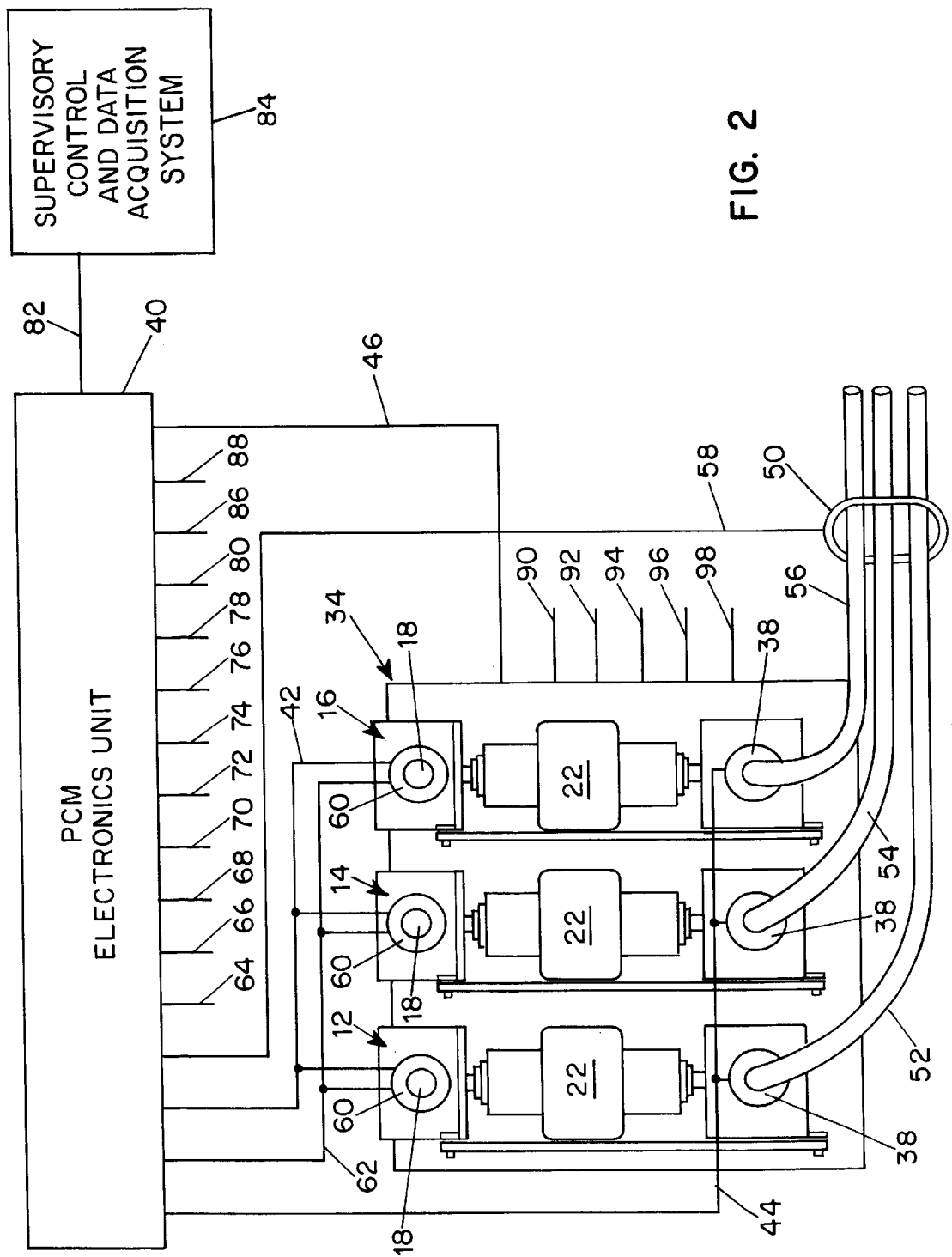
FIG. 2 is a rear view of the embodiment shown in FIG. 1.

In the typical embodiment of the invention shown in FIGS. 1 and 2, a PCM module arrangement containing a circuit breaker 10 including three vacuum interrupters 12, 14 and 16 for the three phases of a power circuit. Each interrupter includes a power line side contact 18 and a load side contact 20 and a vacuum bottle 22 connected to the contacts 18 and 20 by conductive straps 24 and 26, respectively.

The contacts 18 and 20 are supported in spaced relation in bushings 28 at opposite ends of each vacuum bottle 22 by insulating support members 30 and 32, respectively, which are mounted at their opposite ends on a circuit breaker operating mechanism 34.

In order to sense current flow on both the line side and the load side of each interrupter 12, 14 and 16, a separate line side Rogowski coil 36 encloses each line side contact 18 and a separate load side Rogowski coil 38 surrounds each load side contact 20, each of the Rogowski coils being connected to a PCM electronics unit 40 through corresponding lines 42 and 44 to supply sensed phase current signals thereto. Upon detection of excess current signals, the PCM electronics unit 40 sends a signal on a line 46 to the breaker operating mechanism 34 to open the corresponding circuit breaker through a linkage 48 in the usual manner. As shown in FIG. 2, a zero sequence current sensor 50 surrounds three load side cables 52, 54 and 56 leading from the circuit breaker to supply a zero sequence or current balance signal on a line 58 to the electronics unit 40.

A line side current transformer 60 at each of the line side contacts 18 supplies backup control power to the electronics unit 40 through corresponding lines 62. The current transformers 60 may be installed in the line side or load side contact bushing 28 and may also be incorporated in the corresponding Rogowski coil sensors 36 or 38.

The current-carrying parts and insulation of the PCM module circuit breaker arrangement 10 and the PCM electronics unit 40 are designed, tested and rated to allow application over a voltage range of 5–15 KV and a frequency range of 50–400 Hz and to allow various system ground configurations, i.e., high, medium, hybrid, low or effective.

The Rogowski coils 36 and 38 provide phase current sensing on both line and load sides of the contacts in each vacuum bottle 22 in each interrupter 12, 14 and 16 as an integral part of the circuit breaker arrangement. The circuit breaker arrangement also provides an interface for the zero sequence current sensor 50 providing a signal on line 58 from the load side of the circuit breaker cabling that is analogous to the zero sequence or current balance signal used to detect low level, i.e., sensitive ground faults.

The PCM electronics unit 40 has a conventional control power input 64 and, upon loss of power from that input, backup control power is supplied through the lines 62 from the current transformers 60 sensing the circuit breaker phase current.

In addition, the load and line side phase currents from the Rogowski coils 36 and 38, supplied to the PCM electronics unit 40 on the lines 42 and 44, provide redundant detection of phase currents and can, therefore, automatically detect failure of a current sensor. Also, three phase line side and load side voltage signals are supplied from external voltage sensors which are not a part of the PCM module to the PCM electronics unit 40 through corresponding lines 66 and 68, respectively. These signals, used in conjunction with a supervising control and data acquisition system 84 which is connected to the PCM electronics unit through a line 82, enable automatic synchronization across the circuit breaker. These voltage signals also permit over-voltage, under-voltage, voltage balance and differential voltage parameters to be monitored. The zero sequence and negative sequence voltages are derived from the voltage signals supplied on the line 66 by the PCM electronics unit 40.

In order to provide zonal interlocking, the PCM electronics unit 40 is connected by a line 70 to other PCM modules associated with a zonal distribution architecture containing multiple series connected switchboards to send and receive signals providing bi-directional phase current zonal interlock or bi-directional phase current comparison protection. Similarly, a line 72 interconnects the PCM modules to provide zonal interlock or bi-directional ground current comparison protection for sensitive ground faults. This allows the PCM modules closest to a fault to respond immediately while blocking the tripping action of upstream PCM modules. This also allows emulation of bus differential protection schemes using directional comparison. This arrangement is normally utilized as backup protection for the differential methods which usually provide the primary protection.

Another line 74 connects the PCM electronics unit 40 with corresponding PCM electronics units associated with other PCM modules having the line sides of their circuit breakers connected to a common bus or switchboard, permitting all of the PCM electronic units to sum the phase currents and their zero sequence currents, thereby permitting detection of any phase or ground differential current indicative of a fault within the bus or switchboard zone of protection.

Furthermore, a line 76 supplies the PCM electronics unit 40 with phase current signals from the remote end of a circuit to which the load side of a particular PCM module's circuit breaker is connected. By detecting these phase current differentials for the circuit, which may be a generator, transformer, bus tie, feeder or motor circuit, phase faults are detected in the equipment and the cable connecting it to the PCM module.

Another line 80 connects the electronics unit 40 to a current sensor that provides system ground point current to permit over-current detection of a system ground fault as well as providing a zero sequence polarizing quantity to the PCM electronics unit.

In addition, a line 78 provides a system ground point voltage signal, permitting the PCM electronics unit 40 to detect over-voltage of the fundamental frequency indicative of a ground fault on the system. Under-voltage of the third harmonic frequencies may also be detected when the electric plant is grounded through the generator neutral to detect loss of system ground or a ground fault in close proximity to the generator neutral.

The PCM electronics unit 40 also has an input 82 from the supervisory control and data acquisition system 84 which permits adjustment of all protection function settings, provides for monitoring of power parameters, provides open/ close control including auto synchronization close control of the PCM module circuit breaker and allows voltage and frequency signals to be used for controlling generator excitation and speed regulation.

Another input line 86 to the PCM electronics unit 40 provides a zero sequence current signal from a separate PCM module electronics unit located at the opposite end of a tie circuit to which a particular PCM module circuit breaker is connected. This permits detection of low values of ground differential currents on the tie cable.

A safety ground line 88 connects the PCM electronics unit to the equipment ground and another safety ground line 90 connects the circuit breaker operating mechanism 34 to equipment ground so as to limit voltage rises on the equipment and to provide a continuous current path for ground currents resulting from fault conditions. For the circuit breaker operating mechanism, a line 92 provides the control power signal required to operate, i.e. trip or close, the circuit breaker 10, and two lines 94 and 96 provide direct tripping and closing signals, respectively, to operate the circuit breaker independently of the PCM electronics unit 40. Finally, another line 98 to the circuit breaker operating mechanism 34 is connected to auxiliary contacts in the circuit breaker.

By providing a broad selection of system parameter input signals to the PCM electronics unit, more PCM functions can be integrated into and configured by a single design of the electronics unit of the PCM module. This is advantageous because it minimizes the number of discrete sensors and discrete PCM logic devices required for each different equipment application. It is also more advantageous for an overall electric plant containing diverse equipment since only a single PCM electronics unit needs to be maintained, the PCM functions appropriate to the particular application being configurable by the PCM electronics unit.

Moreover, the PCM electronics unit can selectively locate a phase or ground fault for electric plant distribution systems which require distributed architectures, flexible operation and very restricted design ground fault currents and can do so with a minimum number of discrete sensors and logic devices. In this regard, such distribution systems may contain looped architecture and/or zonally connected architecture having multiple switchboards connected in series with multiple circuit breakers and having multiple tie cables interconnecting them. Such distribution systems may also have multiple generator connections made directly to various distributed switchboards throughout the electric plant. Furthermore, in such systems power flow may normally be from either end or a combination of both ends of a distribution network whether it is looped or zonal.

The electric plant system ground may also be high resistance grounded. The system ground may be at the neutral of a wye wound generator winding or through a grounding transformer from a generator switchboard.

The PCM electronics unit as described herein can implement phase fault and sensitive ground fault detection based on differential current sensing methods, i.e., phase currents and zero sequence currents, and backup protection arrangements based on bidirectional current comparison methods capable of blocking upstream breaker tripping, i.e., zonal interlocking. The bidirectional protection method allows independent, overcurrent settings for each of two directions of current flow through the circuit breaker. Sensitive ground fault current detection is primarily provided by the zero sequence sensor however backup ground fault detection can be implemented by deriving the zero sequence current numerically from the phase current measurements. The ability to detect in line faults is enhanced by incorporating load and line side voltage signal inputs into the PCM electronics unit. The PCM module arrangement of the invention also integrates bus differential, i.e., phase and sensitive ground, and circuit differential, i.e., phase and sensitive ground for bus ties, phase only for other equipment types, into the PCM electronics unit thereby minimizing the number of current sensors and logic devices required while providing a greater degree of protection.

Figure 3:
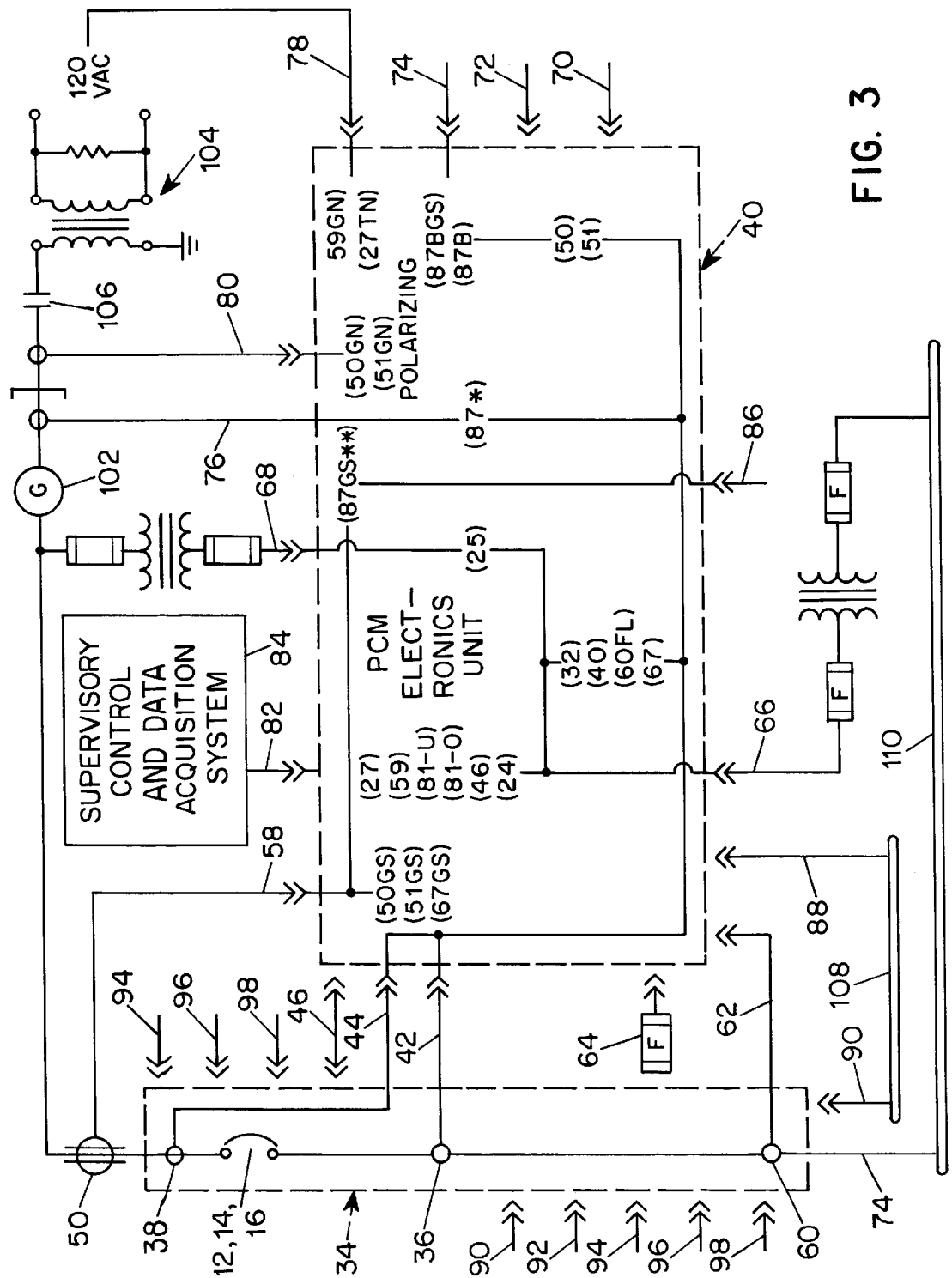
FIG. 3 is a schematic circuit diagram illustrating a PCM module arrangement as applied to a generator with a high resistance system ground connected to the generator neutral.

FIG. 3 is a schematic diagram showing a typical application of the PCM module to a generator 102 having a high resistance ground 104 connected to the generator neutral through a contact 106. A bus 108 and the lines 88 and 90 are connected directly to earth. Three phase electrical power is delivered to a bus 110 through the line 74 from the generator. As shown by FIG. 3, circuit breaker 10 in the PCM module and the associated PCM electronics unit 40 incorporate the following standard protective functions, which are indicated by standard numbers in parentheses, as defined in IEEE 37.2, thereby allowing the PCM functions to be enabled, disabled and configured to meet the requirements of specific applications:

Volts/Hz (24), auto-synchronize and close (25), under-voltage (27), neutral ground third harmonic under-voltage (27TN), reverse power (32), loss of field (40), negative sequence, (voltage and current balance) (46), instantaneous over-current (50), time over-current (51), instantaneous over zero sequence current (50GS), time over zero sequence current (51GS), instantaneous neutral ground over-current (50GN), time neutral round over-current (51GN), over-voltage (59), neutral ground over-voltage (59GN), VT control power fuse failure detection (60FL), Bi-directional phase over-current (67) with ability to block or interlock tripping of other series connected circuit breakers, Bi-directional sensitive ground over-current (67GS) with ability to block or interlock tripping action of other series connected circuit breakers, over frequency (81-O), under frequency (81-U), circuit differential (87\*), (*needs to accommodate generator, transformer, motor and bus tie circuits), circuit zero sequence differential (**87GS\*\*) ( used predominately for bus tie cables), switchboard (bus) phase current differential (87B), switchboard (bus) zero sequence differential (87BGS). Other protection functions may be provided. For example, incipient fault protection may be provided since line side and load side-voltage signals can be monitored and both current and voltage balance conditions can be monitored. Detection of loss of vacuum in a vacuum bottle may be facilitated and failure of a phase current sensor may be facilitated by comparing the phase current signals on both line and load sides of each phase.

The control functions provided by the PCM module include but are not limited to the following:

The ability to trip/close circuit breakers through the supervisory control and data acquisition system 84 and the electronics unit 40 for the PCM module or directly through the circuit breaker operating mechanism 34; the ability to automatically synchronize and close across a generator or switchboard tie circuit breakers utilizing the circuit breaker 10 in the PCM module and the PCM electronics unit 40 and the supervisory control and data acquisition system 84; the ability to directly provide frequency, voltage, current, power, and power factor information from the PCM electronics unit to the supervisory control and data acquisition system, some of which is required to maintain generator excitation and speed regulation.

The monitoring functions provided by the PCM module electronics unit include but are not limited to monitoring of the following:

a. frequency;
b. individual phase currents;
c. zero sequence current;
d. direction of the three phase current;
e. direction of zero sequence current;
f. system ground point current (polarizing quantity);
g. system ground point voltage;
h. phase differential currents associated with each circuit connected to the load side of a PCM module;
i. phase and zero sequence differential currents for all switchboards and tie cables;
j. negative sequence (current and voltage balance) derived by the PCM electronics unit;
k. zero sequence voltage (polarizing quantity) derived by the PCM electronics unit;
l. individual and total harmonic distortion levels derived by the PCM electronics unit;
m. each of the line side phase and line voltages;
n. each of the load side phase and line voltages;
o. differential voltage (phase and line) between line and load voltages; and
p. power parameters derived by the PCM electronics unit including but not limited to: apparent power, real power, reactive power and power factor.

FIG. 3 also shows the zero sequence current connection 58 connected to allow ground fault detection by utilizing the 50GS and 51GS functions. This arrangement can be used if the system is grounded at the switchboard through a neutral deriving transformer rather than the generator neutral. FIG. 3 also identifies the 87\* function which is the phase current "circuit" differential protection provided by the PCM electronics unit for the generator and generator cabling. Note that the differential protection must be configurable to accommodate optimal application with a cable tie, generator, transformer or motor and must allow detection of ground faults on tie cables with system grounding designs that restrict ground fault currents consistent with high resistance system grounding.

FIG. 3 further depicts the 87B and 87 BGS functions that allow all of PCM modules that are connected to a common bus to be jointly connected to provide protection for the switchboard against internal faults. This must be effective with relatively large numbers of PCM modules connected to the bus, i.e. ten PCM modules and with design ground fault currents limited to levels consistent with high resistance system grounding.

Although the invention has been described herein with reference to specific embodiments, many modifications and variations therein will readily occur to those skilled in the art. Accordingly, all such variations and modifications are included within the intended scope of the invention.

We claim:

1. A PCM module arrangement comprising a three phase circuit breaker and a PCM electronics unit providing protection, control and monitoring functions, the circuit breaker including a Rogowski coil located on at least one of the line side and the load side of each phase for detecting current through each phase and supplying corresponding signals to the PCM electronics unit, a zero sequence current sensor enclosing a plurality of load side conductors from the circuit breaker and supplying a corresponding signal to the PCM electronics unit, and a circuit breaker operating mechanism for opening/closing the circuit breakers, wherein the PCM electronics unit integrates multiple protection, control and monitoring functions into a single logic device and provides for a plurality of interface signals.

2. A PCM module arrangement according to claim 1 wherein the circuit breaker sensors and PCM electronics unit are rated for operation over the voltage range of 5 to 15 kv and a frequency range of 50–400 Hz.

3. A PCM module arrangement according to claim 1 wherein the PCM electronics unit enables selective location of ground faults in electric plant generation and distribution systems which have distributed architecture and high impedance system grounding.

4. A PCM module arrangement according to claim 1 wherein the PCM electronics unit can be configured to provide different protection, control and monitoring functions depending on the type of electrical component equipment and apparatus to which the PCM module is connected.

5. A PCM module arrangement according to claim 1 including means for providing primary protection for both phase and sensitive ground faults using differential methods while simultaneously providing backup protection for phase and sensitive ground faults using bidirectional current comparison methods including an ability to block tripping of PCM modules not directly connected to a faulted section of a protected system.

6. A PCM module arrangement according to claim 1 including means for simultaneously providing switchboard bus differential protection against both phase and sensitive ground faults with respect to a switchboard bus zone of protection connected to the line side of the circuit breaker and providing circuit differential protection against both phase and sensitive ground faults with respect to a zone of protection connected to the load side of the circuit breakers.

7. A PCM module arrangement according to claim 1 including a vacuum bottle interrupter in each phase and means for detecting loss of vacuum in a vacuum bottle by comparing phase current trending data during opening and closing operations of the circuit breaker.

* * * * *